(12) United States Patent
Ikemoto et al.

(10) Patent No.: US 9,197,803 B2
(45) Date of Patent: Nov. 24, 2015

(54) CAMERA MODULE

(71) Applicant: Murata Manufacturing Co., Ltd., Nagaokakyo-shi, Kyoto-fu (JP)

(72) Inventors: Nobuo Ikemoto, Nagaokakyo (JP); Atsushi Kumano, Nagaokakyo (JP); Jerry Hsieh, Nagaokakyo (JP); Jun Sasaki, Nagaokakyo (JP)

(73) Assignee: Murata Manufactruing Co., Ltd., Kyoto (JP)

( * ) Notice: Subject to any disclaimer, the term of this patent is extended or adjusted under 35 U.S.C. 154(b) by 0 days.

(21) Appl. No.: 14/483,190

(22) Filed: Sep. 11, 2014

(65) Prior Publication Data

US 2014/0375876 A1    Dec. 25, 2014

Related U.S. Application Data

(63) Continuation of application No. PCT/JP2014/053400, filed on Feb. 14, 2014.

(30) Foreign Application Priority Data

Mar. 27, 2013   (JP) ................................. 2013-067427

(51) Int. Cl.
*H04N 5/225*   (2006.01)
*H05K 1/18*    (2006.01)
*H01L 27/146*  (2006.01)
*H05K 1/02*    (2006.01)

(52) U.S. Cl.
CPC ........... *H04N 5/2257* (2013.01); *H04N 5/2253* (2013.01); *H04N 5/2254* (2013.01); *H05K 1/182* (2013.01); *H01L 27/14618* (2013.01); *H01L 2224/16225* (2013.01); *H05K 1/0298* (2013.01); *H05K 1/185* (2013.01); *H05K 2201/09845* (2013.01); *H05K 2201/10121* (2013.01)

(58) Field of Classification Search
CPC . H04N 5/2257; H04N 5/2254; H04N 5/2253; H05K 1/182; H05K 2201/10121; H05K 2201/09845; H05K 1/185; H05K 1/0298; H01L 2224/16225; H01L 27/14618; H01L 2924/00; H01L 2224/32225; Y10T 29/4913; G03B 17/02

See application file for complete search history.

(56) References Cited

U.S. PATENT DOCUMENTS 6,933,615 B2 *  8/2005  Maeda ..................... H01L 24/81
                                                    257/775
7,271,495 B2 *  9/2007  Prengel ............. H01L 23/49816
                                                    257/774

(Continued)

FOREIGN PATENT DOCUMENTS

JP   2007-165460 A    6/2007
JP   2007-306307 A   11/2007

(Continued)

OTHER PUBLICATIONS

Official Communication issued in International Patent Application No. PCT/JP2014/053400, mailed on Mar. 25, 2014.

*Primary Examiner* — Aung S Moe
(74) *Attorney, Agent, or Firm* — Keating & Bennett, LLP

(57) ABSTRACT

A camera module includes an image sensor IC, a resin multilayer board including thermoplastic resin layers stacked in a direction perpendicular or substantially perpendicular to a light receiving surface of the image sensor IC, a mounting electrode which is stacked on the thermoplastic resin layer and on which the image sensor IC is mounted, and a via-hole conductor electrically connected to the mounting electrode. The resin multilayer board includes a flat plate portion including a surface on which the mounting electrode is mounted, and a rigid portion including a greater number of thermoplastic resin layers than that of the flat plate portion, and the via-hole conductor is arranged in the flat plate portion so as to avoid the thermoplastic resin layer on which the mounting electrode is stacked.

16 Claims, 6 Drawing Sheets

(56) References Cited

U.S. PATENT DOCUMENTS

2004/0069998 A1* 4/2004 Harazono ......... H01L 27/14618
257/81
2010/0276187 A1 11/2010 Nakamura et al.
2015/0070577 A1* 3/2015 Ikemoto ............... H04N 5/2253
348/374

FOREIGN PATENT DOCUMENTS

| JP | 2007-318249 A | 12/2007 |
|----|---------------|---------|
| JP | 2009-170753 A | 7/2009 |
| JP | 2011-233716 A | 11/2011 |
| JP | 2013-16702 A | 1/2013 |

* cited by examiner

PRIOR ART

CAMERA MODULE

BACKGROUND OF THE INVENTION

1. Field of the Invention

The present invention relates to a camera module in which a lens unit and an image sensor are provided on a resin multilayer board made of a thermoplastic resin and having flexibility.

2. Description of the Related Art

At present, most of portable devices such as cellular phones, PDAs, and the like have a photographing function. As a camera module that realizes such a photographing function, a module including a flexible board is used in some cases (see, e.g., Japanese Unexamined Patent Application Publication No. 2007-165460).

FIG. 6A is a cross-sectional view of a part of an existing camera module 101 disclosed in Japanese Unexamined Patent Application Publication No. 2007-165460, as seen from a side thereof.

The camera module 101 includes a flexible printed circuit board (FPC) 102, an optical unit 103, an image sensor 104, a connector 105, and an infrared (IR) shielding filter 106. The FPC 102 has flexibility. In addition, the FPC 102 has an opening 102A and a plurality of via-hole conductors 102B. The optical unit 103 is provided on one principal surface of the FPC 102 so as to be opposed to the opening 102A. In addition, the optical unit 103 includes a lens barrel 103A and a housing 103B. The housing 103B includes a partition wall which partitions the interior thereof into a space at a side close to the FPC 102 and a space at a side away from the FPC 102. The partition wall has an opening 103C. The lens barrel 103A is provided in the space of the housing 103B at the side away from the FPC 102. The IR shielding filter 106 is provided on the one principal surface of the FPC 102. The IR shielding filter 106 is opposed to the opening 102A within the space of the housing 103B at the side close to the FPC 102. The image sensor 104 is an IC component. In addition, the image sensor 104 is provided on the other principal surface of the FPC 102. The image sensor 104 includes a plurality of photodetectors 104A and a plurality of bumps 104B on a surface thereof opposed to the FPC 102. Each photodetector 104A receives light incident thereon through the lens barrel 103A, the opening 103C of the housing 103B, the IR shielding filter 106, and the opening 102A of the FPC 102 in order. Each bump 104B is connected to the connector 105 via the via-hole conductor 102B of the FPC 102 and a wiring pattern which is not shown.

FIG. 6B is an exploded perspective view showing the FPC 102 and the image sensor 104.

The plurality of photodetectors 104A are arranged in a matrix manner in a rectangular region located at the center of the surface of the image sensor 104 that is opposed to the FPC 102. In addition, the plurality of bumps 104B are arranged in an annular region surrounding the plurality of photodetectors 104A of the image sensor 104.

In the FPC 102, the opening 102A is formed in a region opposed to the plurality of photodetectors 104A of the image sensor 104. In addition, the plurality of via-hole conductors 102B of the FPC 102 are formed in a region opposed to the plurality of bumps 104B of the image sensor 104.

An adhesion method using an anisotropic conductive film (ACF) is used for joining the plurality of bumps 104B of the image sensor 104 and the plurality of via-hole conductors 102B of the FPC 102. It should be noted that in mounting an IC component such as the image sensor 104 on the FPC 102 or the like, an ultrasonic joining method or the like other than an adhesion method may be used.

In a mounting method such as an adhesion method, an ultrasonic joining method, or the like, an IC component such as an image sensor and an FPC may be heated or pressed. If the FPC is formed from a thermoplastic resin, the thermoplastic resin is plasticized even at a relatively low temperature. Thus, in a mounting method involving heating or pressing, flowing of the thermoplastic resin occurs. Meanwhile, flowing of a via-hole conductor formed in the FPC does not occur unless the temperature is sufficiently higher than the temperature at which the thermoplastic resin is plasticized. In addition, the thermoplastic resin less flows around the via-hole conductor. Therefore, in heating or pressing the FPC, the FPC non-uniformly deforms. Thus, the flatness of the FPC may be impaired. For example, a deformation may occur such that a portion at which the via-hole conductor is present projects. If so, the image sensor is mounted on the FPC so as to be tilted. This may have a great effect on the optical characteristics of the camera module. When a plurality of via-hole conductors are non-uniformly arranged or when an electronic component is embedded within an FPC, the tilt of the image sensor tends to be significantly increased.

SUMMARY OF THE INVENTION

Therefore, preferred embodiments of the present invention provide a camera module having highly stable optical properties.

A camera module according to a preferred embodiment of the present invention includes an image sensor including a light receiving surface, a lens unit configured to condense light on the light receiving surface, a resin multilayer board in which a plurality of thermoplastic resin layers are stacked in a direction perpendicular or substantially perpendicular to the light receiving surface of the image sensor, a mounting electrode provided on a thermoplastic resin layer, which is a front layer of the resin multilayer board, and on which the image sensor is mounted, and a via-hole conductor provided within at least one of the thermoplastic resin layers of the resin multilayer board and electrically connected to the mounting electrode. The resin multilayer board includes a flat plate portion including a surface on which the mounting electrode is provided, and a rigid portion in which thermoplastic resin layers larger in number than those of the flat plate portion are stacked, and the via-hole conductor is configured to avoid in the flat plate portion the thermoplastic resin layer which is a front layer on which the mounting electrode is provided.

In this configuration, even when heating or pressing is involved in mounting the image sensor on the mounting electrode, since the via-hole conductor is configured to avoid the thermoplastic resin layer which is the front layer of the flat plate portion on which the mounting electrode is provided, the thermoplastic resin in the front layer of the flat plate portion relatively uniformly flows. Therefore, high flatness is maintained in the resin multilayer board. Thus, it is possible to mount the image sensor on the resin multilayer board without tilting the image sensor. Therefore, the optical characteristics of the camera module are stabilized.

The above-described via-hole conductor is preferably provided in the rigid portion so as to avoid the flat plate portion. By so doing, even when heating or pressing is involved in mounting the image sensor on the mounting electrode, the thermoplastic resin relatively uniformly flows in the entire flat plate portion. Therefore, it is possible to achieve higher flatness in the resin multilayer board. Thus, it is possible to prevent tilt of the image sensor.

When the above-described camera module includes a mounted component embedded in the resin multilayer board, the mounted component is preferably provided in the rigid portion so as to avoid the flat plate portion. By so doing, even when heating or pressing is involved in mounting the image sensor on the mounting electrode, it is possible to significantly reduce or prevent non-uniform flowing of the thermoplastic resin around the embedded component.

The above-described rigid portion preferably overlaps a side of the image sensor. By so doing, it is possible to block light traveling around from the side of the image sensor to the light receiving surface. In addition, it is possible to significantly reduce or prevent entry of dust or the like from the side of the image sensor to the light receiving surface side. Therefore, the optical characteristics of the camera module are further stabilized.

Preferably, the above-described light receiving surface faces the flat plate portion side, and the above-described flat plate portion includes a through hole facing the light receiving surface.

According to various preferred embodiments of the present invention, even when heating or pressing is involved in mounting the image sensor on the mounting electrode, high flatness is maintained in the resin multilayer board. Thus, it is possible to mount the image sensor on the resin multilayer board without tilting the image sensor. Therefore, the optical characteristics of the camera module are stabilized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A camera module according to a first preferred embodiment of the present invention will be described. Here, a resin multilayer board includes a mounting portion on which an image sensor is mounted, a mounting portion on which a connector is mounted, and a flat cable-shaped connection portion. The two mounting portions are connected to each other via the connection portion. In this manner, the resin multilayer board is preferably integrally formed. It should be noted that in each drawing used in the following description, not all conductor patterns and circuit elements are shown, and only a characteristic portion of the present invention is shown.

Figure 1:
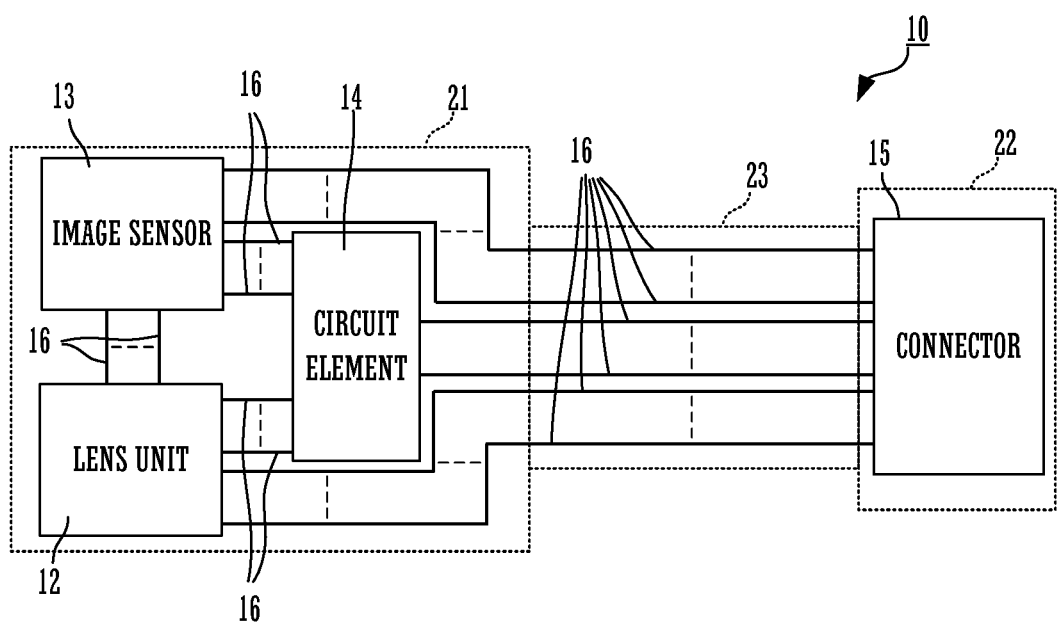
FIG. 1 is a functional block diagram of a camera module according to a first preferred embodiment of the present invention.

FIG. 1 is a functional block diagram of a camera module 10 according to the first preferred embodiment of the present invention.

The camera module 10 includes mounting portions 21 and 22 and a connection portion 23. In addition, the camera module includes a lens unit 12, an image sensor IC 13, a circuit element 14, a connector 15, and a wiring portion 16. The lens unit 12, the image sensor IC 13, the circuit element 14, and part of the wiring portion 16 are provided at the mounting portion 21. The connector 15 and one other portion of the wiring portion 16 are provided at the mounting portion 22. The other portion of the wiring portion 16 is provided at the connection portion 23. The details of the mounting portion 21, the mounting portion 22, and the connection portion 23 will be described later. The wiring portion 16 connects the lens unit 12, the image sensor IC 13, the circuit element 14, and the connector 15 to each other.

Figure 2A:
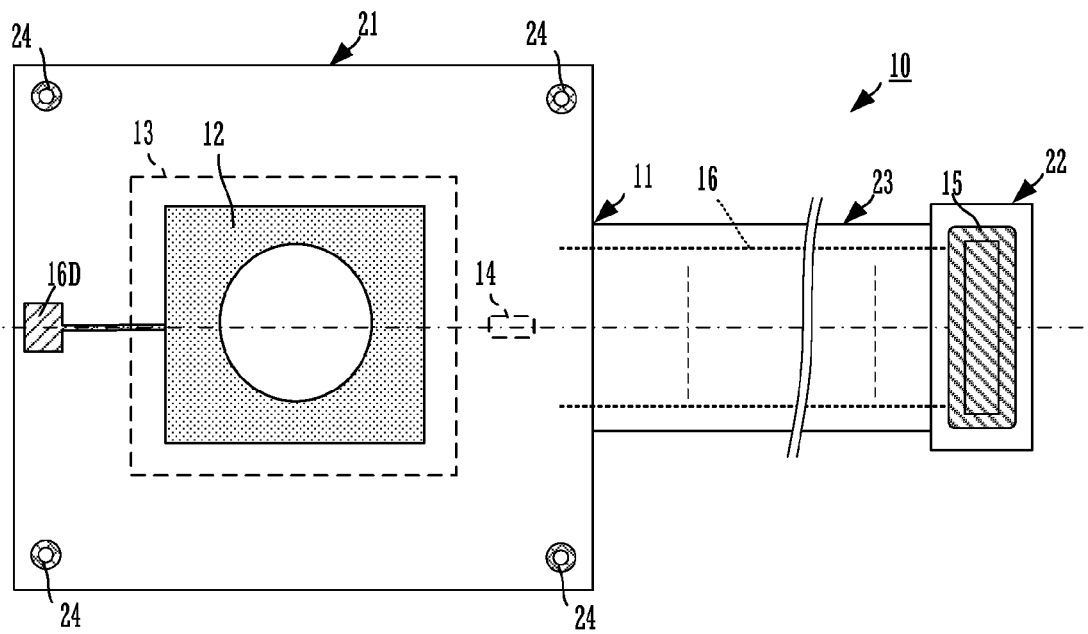
FIGS. 2A and 2B are a plan view and a cross-sectional side view of the camera module according to the first preferred embodiment of the present invention.

FIG. 2A is a plan view of the camera module 10 as seen from one principal surface side.

The camera module 10 further includes a resin multilayer board 11. The resin multilayer board 11 is formed preferably by stacking a plurality of resin layers made of a thermoplastic resin. For example, a material having flexibility and thermoplasticity such as polyimide, a liquid crystal polymer, or the like is used as the thermoplastic resin. It should be noted that the liquid crystal polymer is a more preferable material since it has high water resistance as compared to other thermoplastic resins such as polyimide and thus dimension change due to water absorption is significantly reduced or prevented.

In addition, the resin multilayer board 11 includes the mounting portion 21, the mounting portion 22, and the connection portion 23. The mounting portion 21 preferably has a quadrangular plate shape when one principal surface thereof is seen in a plan view from a thickness direction thereof. The mounting portion 21 is connected to one end of the connection portion 23. In addition, the mounting portion 21 includes a plurality of through holes 24. The plurality of through holes 24 are located near the four corners of the mounting portion 21. A screw or the like is mounted in each through hole 24 in mounting to an external device. The mounting portion 22 preferably has a rectangular or substantially rectangular plate shape having a smaller dimension than the mounting portion 21 when one principal surface thereof is seen in a plan view from a thickness direction thereof. The mounting portion 22 is connected to another end of the connection portion 23. The connection portion 23 preferably has a band shape having a narrower width than the mounting portions 21 and 22 and having a longitudinal direction which is a direction connecting the mounting portion 21 and the mounting portion 22 when one principal surface thereof is seen in a plan view from a thickness direction thereof. It should be noted that although not shown, resist layers having insulating properties are provided on both principal surfaces of the resin multilayer board 11 as appropriate.

The wiring portion 16 is provided within the resin multilayer board 11. The wiring portion 16 extends from the mounting portion 21 through the connection portion 23 to the mounting portion 22. The wiring portion 16 connects the lens unit 12, the image sensor IC 13, the circuit element 14, and the connector 15 to each other.

The connector 15 is mounted on one principal surface of the mounting portion 22. It should be noted that the connector 15 is not limited to being provided on the one principal surface of the resin multilayer board 11 and may be provided at the other principal surface side of the resin multilayer board 11.

The circuit element 14 is provided within the mounting portion 21. It should be noted that the circuit element 14 is not limited to being provided within the resin multilayer board 11 and may be mounted on the one principal surface or the other principal surface of the resin multilayer board 11. The circuit element 14 is provided as appropriate according to the circuit configuration. The circuit element 14 is a passive element such as a capacitor element, an inductor element, a resistor element, a filter element, or the like. It should be noted that the circuit element 14 may be an active element other than a drive portion of the lens unit 12 and the image sensor IC 13.

The lens unit 12 is mounted on one principal surface of the mounting portion 21. Although not shown, the mounting portion 21 includes a through hole 21C at a position covered with the lens unit 12. The lens unit 12 guides (condenses) externally-incident light to the through hole 21C.

The image sensor IC 13 is provided at the other principal surface side of the mounting portion 21. The image sensor IC 13 is configured to capture an image. The image sensor IC 13 receives light incident thereon from the lens unit 12 through the through hole 21C. In addition, the image sensor IC 13 is configured to perform a communication function. In other words, the image sensor IC 13 receives a control signal inputted thereto via the wiring portion 16 and the connector 15. In addition, the image sensor IC 13 outputs image data via the wiring portion 16 and the connector 15. Moreover, the image sensor IC 13 is configured to perform a function to control focusing in the lens unit 12 and the like. In other words, the image sensor IC 13 outputs a control signal to the drive portion of the lens unit 12 via the wiring portion 16.

Figure 2B:
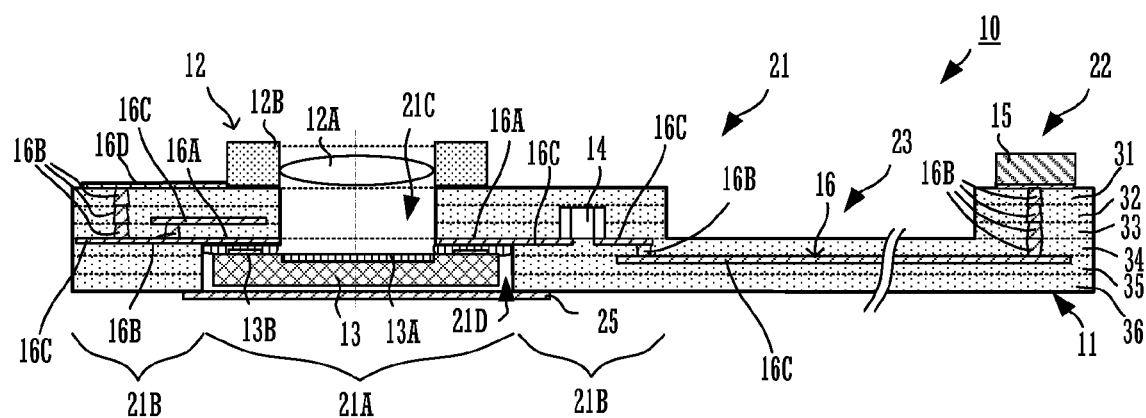

FIG. 2B is a cross-sectional side view of the camera module 10.

The resin multilayer board 11 includes thermoplastic resin layers (hereinafter, referred to as resin layers) 31, 32, 33, 34, 35, and 36. The resin layers 31, 32, 33, 34, 35, and 36 are stacked in order from the one principal surface side to the other principal surface side. Therefore, the one principal surface of the resin multilayer board 11 is a surface at the resin layer 31 side. In addition, the other principal surface of the resin multilayer board 11 is a surface at the resin layer 36 side. Each of the resin layers 31 to 36 is preferably made of a thermoplastic resin having a thickness of about 10 μm to about 100 μm, for example. In each of the mounting portion 21 and the mounting portion 22, the resin layers 31 to 36 are stacked. In the connection portion 23, the resin layers 34 to 36 are stacked.

The mounting portion 21, the mounting portion 22, and the connection portion 23 are integrally formed via the shared resin layers 34 to 36. Thus, it is possible to connect the mounting portion 21, the mounting portion 22, and the connection portion 23 to each other without providing any mechanical connection portion such as solder where breakage is likely to occur due to concentration of stress. Therefore, the mounting portion 21, the mounting portion 22, and the connection portion have high reliability of connection at connection portions therebetween.

It should be noted that the thickness of the connection portion 23 preferably may be equal to the thickness of each of the mounting portions 21 and 22, but is smaller than the thickness of each of the mounting portions 21 and 22. By so setting, it is possible to ensure flexibility at the connection portion 23. In addition, it is possible to enhance the strength (rigidity) of the mounting portion 21 and the mounting portion 22. Thus, it is possible to significantly reduce or prevent occurrence of mechanical damage of the image sensor IC 13, the lens unit 12, and the connector 15, which are mounted on the mounting portions 21 and 22. In addition, it is possible to significantly reduce or prevent occurrence of deterioration of optical characteristics caused due to deformation of the mounting portion 21.

In addition, the mounting portion 21 includes a flat plate portion 21A and a rigid portion 21B. In the flat plate portion 21A, the resin layers 31 to 33 are stacked. The through hole 21C is provided in the center of the flat plate portion 21A. The through hole 21C extends through the resin layers 31 to 33 and is opened in one principal surface and the other principal surface of the flat plate portion 21A. The through hole 21C defines and serves as an optical path optically connecting between the lens unit 12 and the image sensor IC 13.

The lens unit 12 covers the through hole 21C at the one principal surface of the flat plate portion 21A. The lens unit 12 includes a lens 12A and a lens drive portion 12B. The lens drive portion 12B is configured to hold the lens 12A. In addition, the lens drive portion 12B is configured to change the position of the lens 12A in the height direction. The lens 12A is disposed such that an optical axis thereof coincides or substantially coincides with the center of the opening of the through hole 21C. The lens 12A is configured to guide (condense) externally-incident light to the through hole 21C.

In the rigid portion 21B, the resin layers 31 to 36 are stacked. The rigid portion 21B is configured so as to surround the flat plate portion 21A. The rigid portion 21B defines a cavity space 21D at the other principal surface side (the resin layer 33 side) of the flat plate portion 21A. The cavity space 21D is a space in which the image sensor IC 13 is housed.

In addition, the camera module 10 includes a flat plate-shaped cover member 25. The cover member 25 covers an opening of the cavity space 21D at the other principal surface side. The cover member 25 is preferably made of a material having a light shielding property. It should be noted that the cover member 25 is preferably a member having higher strength than the resin layers 31 to 36, such as metal. Thus, it is possible to enhance the strength of the mounting portion 21 and improve the shape retention function of the cavity space 21D.

The image sensor IC 13 is disposed within the cavity space 21D. The image sensor IC 13 is mounted on the other principal surface of the flat plate portion 21A. The image sensor IC 13 includes, as a light receiving surface, one principal surface opposed to the flat plate portion 21A. The image sensor IC 13 includes a light receiving region 13A. The light receiving region 13A is provided on the light receiving surface of the image sensor IC 13. In the light receiving region 13A, a plurality of photodetectors are arranged in a matrix pattern. In addition, the image sensor IC 13 includes external connection lands 13B. The external connection lands 13B are provided on the light receiving surface of the image sensor IC 13 and in a region surrounding the light receiving region 13A.

The interior of the cavity space 21D surrounded by the rigid portion 21B and the cover member 25 is shielded from unwanted light by the rigid portion 21B and the cover member 25. Thus, in the image sensor IC 13 disposed within the cavity space 21D, it is possible to prevent unwanted light from being received by the light receiving region 13A.

The wiring portion 16 includes mounting electrodes 16A, via-hole conductors 16B, internal conductor patterns 16C, and a surface conductor pattern 16D.

The mounting electrodes 16A are provided on the other principal surface of the flat plate portion 21A. The mounting electrodes 16A are electrically connected to the lens unit 12, the circuit element 14, and the connector 15 via the via-hole conductors 16B, the internal conductor patterns 16C, and the surface conductor pattern 16D. The image sensor IC 13 is mounted on the mounting electrodes 16A. Specifically, the external connection lands 13B of the image sensor IC 13 and the mounting electrodes 16A are connected to each other directly or indirectly via metal bumps, an anisotropic conductive sheet, or the like.

The surface conductor pattern 16D is provided on the one principal surfaces of the flat plate portion 21A and the rigid portion 21B. The surface conductor pattern 16D is electrically connected to the image sensor IC 13, the circuit element 14, and the connector 15 via the mounting electrodes 16A, the via-hole conductors 16B, and the internal conductor patterns 16C. The lens drive portion 12B of the lens unit 12 is mounted on the surface conductor pattern 16D.

The internal conductor patterns 16C are provided at the interlayer interfaces between the resin layers 31 to 36 in the flat plate portion 21A and the rigid portion 21B of the mounting portion 21, the connection portion 23, and the mounting portion 22. The internal conductor patterns 16C are electrically connected to the image sensor IC 13, the lens unit 12, the circuit element 14, and the connector 15 via the mounting electrodes 16A, the via-hole conductors 16B, and the surface conductor pattern 16D.

The circuit element 14 is a mounted component. The circuit element 14 contacts the internal conductor pattern 16C. Here, the circuit element 14 is buried in the resin layers 31 to in the mounting portion 21. The circuit element 14 is electrically connected to the lens unit 12, the image sensor IC 13, and the connector 15 via the mounting electrodes 16A, the internal conductor patterns 16C, and the surface conductor pattern 16D. It should be noted that the circuit element 14 may be mounted on either one of both principal surfaces of the mounting portion 21.

The via-hole conductors 16B extend through the resin layers 31 and 36 in the mounting portion 21 and the mounting portion 22. The via-hole conductors 16B are electrically connected to the image sensor IC 13, the lens unit 12, the circuit element 14, and the connector 15 via the mounting electrodes 16A, the internal conductor patterns 16C, and the surface conductor pattern 16D. It should be noted that the via-hole conductors 16B may be provided in the connection portion 23, but it is possible to enhance the flexibility of the connection portion 23 by providing the via-hole conductors 16B so as to avoid the connection portion 23.

In the present preferred embodiment, in the mounting portion 21, the via-hole conductors 16B are provided in the rigid portion 21B so as to avoid the flat plate portion 21A (in particular, the resin layer 33). In addition, in the mounting portion 21, the circuit element 14 is also provided in the rigid portion 21B so as to avoid the flat plate portion 21A. Thus, the rigidity at the rigid portion 21B is further enhanced. Furthermore, in the flat plate portion 21A, the flatness is prevented from being decreased due to influence of the via-hole conductors 16B and the circuit element 14.

Here, an effect of ensuring the flatness of the flat plate portion 21A will be described with reference to a method of manufacturing the camera module 10.

FIGS. 3A to 3D are cross-sectional side views showing a non-limiting example of a manufacturing process of the camera module 10.

Figure 3A:
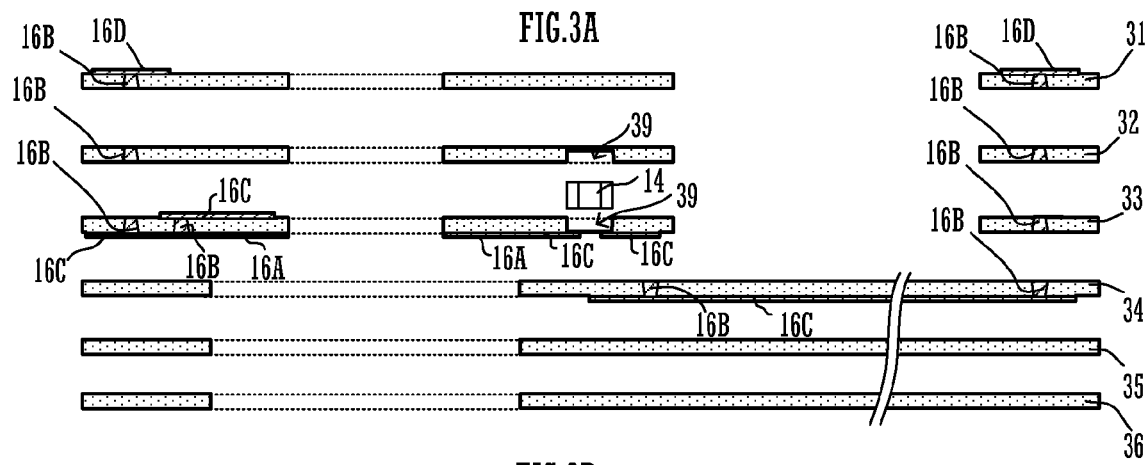
FIGS. 3A to 3D are cross-sectional side views showing a manufacturing process of the camera module according to the first preferred embodiment of the present invention.

FIG. 3A is a cross-sectional side view showing a first step. The first step is a step of forming the resin layers 31 to 36 in a single-layer state.

Specifically, in the first step, first, a plurality of flexible sheets one surface or both surfaces of which are clad with a metal and which have thermoplasticity are prepared. The respective flexible sheets are to form the resin layers 31 to 36. Typically, a copper foil is used a metal film used in such metal-clad flexible sheets.

A patterning process is performed on these flexible sheets by using photolithography and etching technique. By so doing, conductor patterns that are to be the mounting electrodes 16A, the internal conductor patterns 16C, the surface conductor pattern 16D, and the like are formed. In addition, holes are formed in each flexible sheet, and then a conductive paste that is to be the via-hole conductors 16B are filled into the holes. Typically, an alloy containing tin or silver as a principal component is used as a metal used in such a conductive paste. In addition, openings that are to be the cavity space 21D, the through hole 21C, the through holes 24, a component housing space 39 for housing the circuit element 14, and the like are formed in these flexible sheets by die cutting. This step is performed in a multi-sheet state where a plurality of regions each of which is to be a plurality of resin multilayer boards 11 are arranged in a single sheet.

Figure 3B:
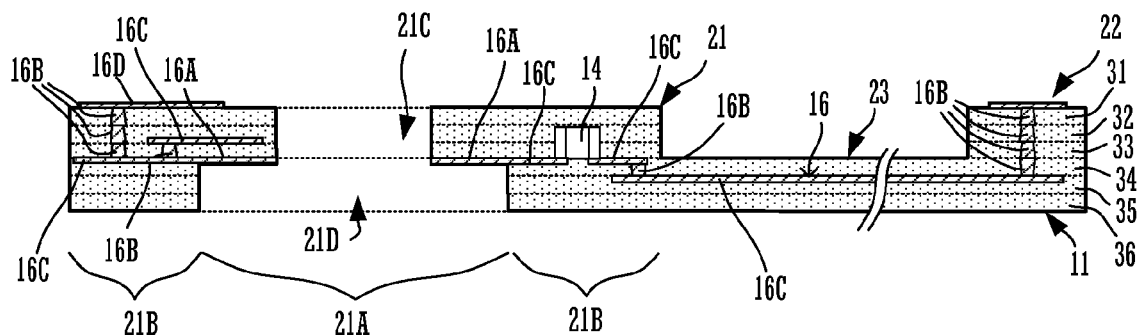

FIG. 3B is a cross-sectional view showing a second step subsequent to the first step. The second step is a step of forming the resin multilayer board 11.

Specifically, in the second step, first, the circuit element 14 is disposed within the component housing space 39 provided in the flexible sheets. Then, the flexible sheets on which the patterning process and the opening formation have been performed are stacked. Next, a plurality of the stacked flexible sheets are bonded by thermocompression bonding. At that time, since the thermoplastic resin is used, it is possible to integrate each flexible sheet without using an adhesive layer such as a bonding sheet or a prepreg. By so doing, the resin multilayer board 11 is formed. In addition, in the thermocompression bonding, the conductive paste is metalized (sintered), such that the via-hole conductors 16B are formed. This step is also performed in a multi-sheet state where a plurality of regions each of which is to be a plurality of resin multilayer boards 11 are arranged.

Figure 3C:
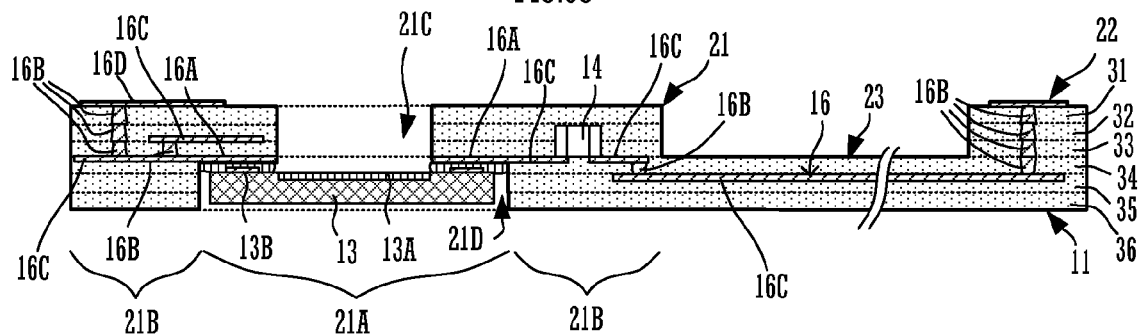

FIG. 3C is a cross-sectional view showing a third step subsequent to the second step. The third step is a step of mounting the image sensor IC 13 on each resin multilayer board 11 in the multi-sheet state.

Specifically, in the third step, the image sensor IC is mounted on each resin multilayer board 11 by ultrasonic bonding or a mounting method using an anisotropic conductive sheet and involving heating or pressing. In such a mounting method involving heating or pressing, in the resin layers 31 to 33 forming the flat plate portion 21A in which the image sensor IC 13 is mounted, the thermosetting resin is plasticized with heating or pressing and flowing of the thermosetting resin occurs. It should be noted that the via-hole conductors 16B are less likely to deform than the thermoplastic resin. In addition, flowing of the thermoplastic resin is reduced around the via-hole conductors 16B. Thus, if the via-hole conductors 16B are provided in the flat plate portion 21A, the flat plate portion 21A non-uniformly deforms and the flatness thereof is impaired. However, in the camera module 10 according to the present preferred embodiment, the via-hole conductors 16B are provided in the rigid portion 21B so as to avoid the thermoplastic resin layer 33 which is a surface layer of the flat plate portion 21A and the thermoplastic resin layers 32 and 31 which are lower layers of the flat plate portion 21A. Thus, the thermoplastic resin relatively uniformly flows in the flat plate portion 21A. In addition, since the via-hole conductors 16B are provided in the rigid portion 21B, deformation of the via-hole conductors 16B which influences the thermoplastic resin layers is less likely to be transmitted to the flat plate portion 21A. Therefore, it is possible to further ensure the flatness of the flat plate portion 21A.

Figure 3D:
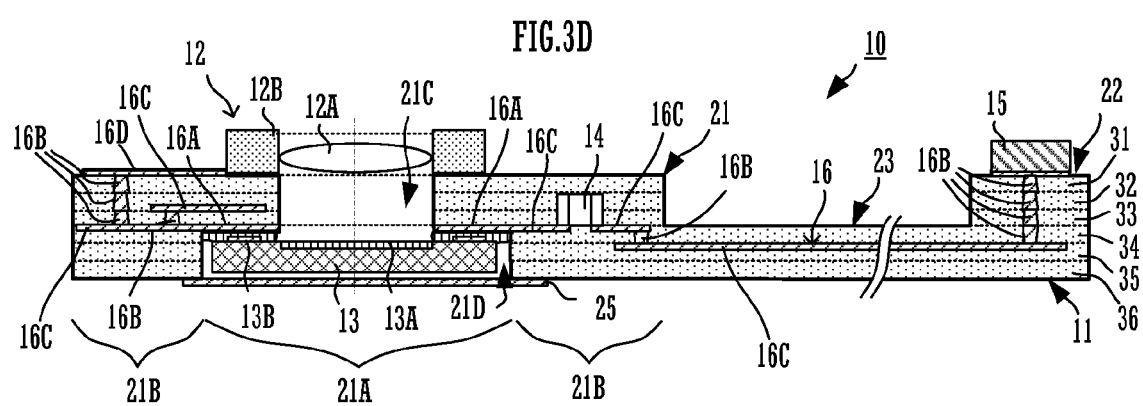

FIG. 3D is a cross-sectional view showing a fourth step subsequent to the third step. The fourth step is a step of mounting the lens unit 12, the connector 15, and the cover member 25 on each stacked element assembly 100 in a multi-sheet state.

Specifically, in the fourth step, the lens unit 12, the connector 15, and the cover member 25 are mounted on each resin multilayer board 11 by a mounting method using solder or the like.

Then, the multi-sheet is cut per resin multilayer board 11. By so doing, the camera module 10 is manufactured.

As described above, regarding the camera module 10 according to the present preferred embodiment, in the third step, the thermoplastic resin relatively uniformly flows in the flat plate portion 21A, and hence high flatness of the flat plate portion 21A is maintained. Thus, it is possible to mount the image sensor IC 13 on the resin multilayer board 11 without tilting the image sensor IC 13. Therefore, the optical characteristics of the camera module 10 are stabilized.

It should be noted that in the camera module 10 according to the present preferred embodiment, the lens unit 12 is disposed at the one principal surface side of the mounting portion 21. In addition, the image sensor IC 13 is disposed within the cavity space 21D at the other principal surface side. Therefore, it is possible to make the thickness of the mounting portion 21 as thin as possible with a required interval ensured between the lens unit 12 and the image sensor IC 13.

Next, a camera module according to a second preferred embodiment of the present invention will be described.

Figure 4:
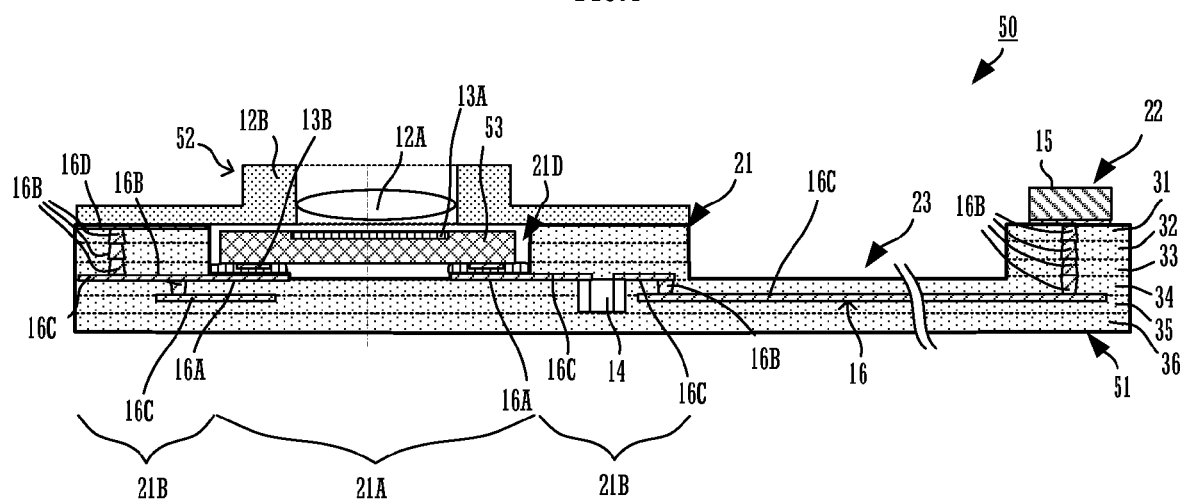
FIG. 4 is a cross-sectional side view of a camera module according to a second preferred embodiment of the present invention.

FIG. 4 is a cross-sectional side view of the camera module 50 according to the second preferred embodiment of the present invention.

The present preferred embodiment is different from the first preferred embodiment in that the position of the image sensor IC is changed to a position close to the lens unit. Specifically, the camera module 50 includes a resin multilayer board 51, a lens unit 52, and an image sensor IC 53.

In the resin multilayer board 51, the through hole which is provided as an optical path in the first preferred embodiment is omitted. In addition, in the resin multilayer board 51, the cavity space 21D is disposed not at another principal surface side of the resin multilayer board 51 but at one principal surface side thereof close to the lens unit 52.

The lens unit 52 covers the entirety of the one principal surface of the mounting portion 21. The lens unit 52 has a dimension so as to close the cavity space 21D.

In the image sensor IC 53, the light receiving region 13A is disposed at the one principal surface side close to the lens unit 52. In the image sensor IC 53, the external connection lands 13B are located at the other principal surface side opposite to the light receiving region 13A.

In such a camera module 50 as well, the flat plate portion 21A and the rigid portion 21B are provided in the mounting portion 21. And, the via-hole conductors 16B are provided in the rigid portion 21B so as to avoid the thermoplastic resin layer (here, the resin layer 34) which is a front layer of the flat plate portion 21A on which the image sensor IC 53 is mounted and the thermoplastic resins (here, the resin layers 35 and 36) which are lower layers of the flat plate portion 21A. Thus, even when heating or pressing is involved in mounting the image sensor IC 53, the thermoplastic resin relatively uniformly flows in the flat plate portion 21A, and it is possible to maintain high flatness of the flat plate portion 21A. Thus, it is possible to mount the image sensor IC 53 on the resin multilayer board 51 without tilting the image sensor IC 53. Therefore, the optical characteristics of the camera module 50 are stabilized.

Next, a camera module according to a third preferred embodiment of the present invention will be described.

Figure 5:
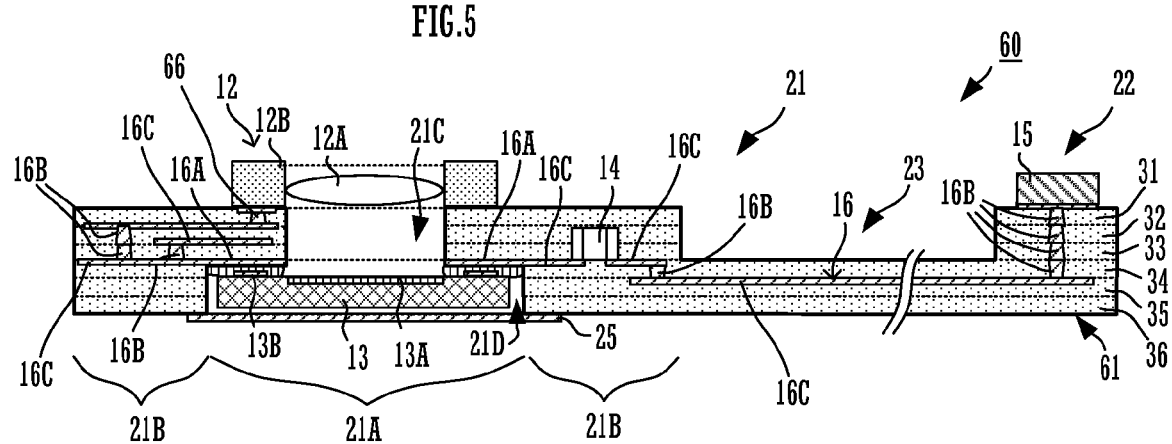
FIG. 5 is a cross-sectional side view of a camera module according to a third preferred embodiment of the present invention.
Figure 6A:
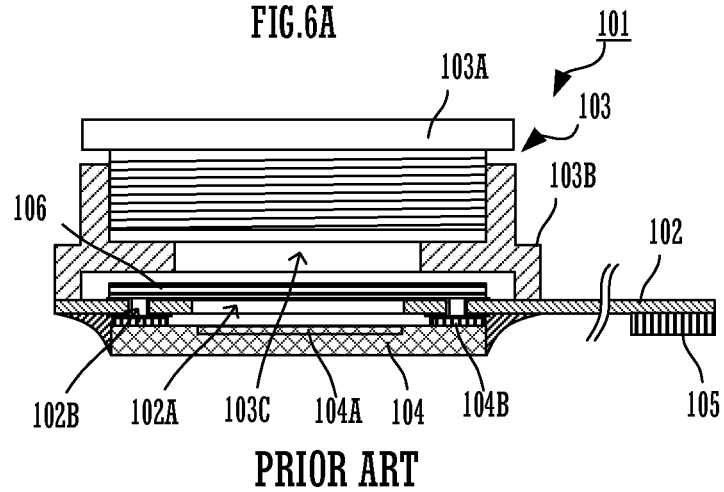
FIGS. 6A and 6B are a cross-sectional side view and an exploded perspective view of a camera module according to a related art example.
Figure 6B:
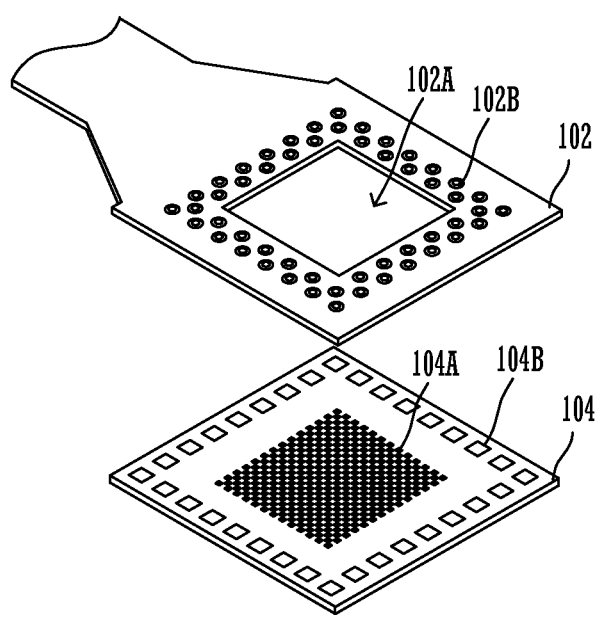

FIG. 5 is a cross-sectional side view of the camera module 60 according to the third preferred embodiment of the present invention.

The present preferred embodiment is different from the first preferred embodiment in that the via-hole conductor is disposed directly below the lens unit in the flat plate portion. Specifically, the camera module 60 includes a resin multilayer board 61, the lens unit 12, and the image sensor IC 13.

In the resin multilayer board 61, the surface conductor pattern 16D which is provided to mount the lens unit 12 in the first preferred embodiment is omitted. And, a via-hole conductor 66 is provided at a position directly below the lens unit 12 in the thermoplastic resin layer (here, the resin layer 31), of the flat plate portion 21A, on which the lens unit 12 is mounted.

In such a camera module 60 as well, the flat plate portion 21A and the rigid portion 21B are provided in the mounting portion 21. And, the via-hole conductors 16B and 66 are configured so as to avoid at least the thermoplastic resin layer (here, the resin layer 33) which is a front layer of the flat plate portion 21A on which the image sensor IC 13 is mounted. Thus, even when heating or pressing is involved in mounting the image sensor IC 13, flowing of the thermoplastic resin in the resin layer 33 relatively uniformly occurs in the flat plate portion 21A. Therefore, it is possible to maintain high flatness of the flat plate portion 21A.

It should be noted that the position of the via-hole conductor 66 provided in the flat plate portion 21A is preferably spaced away from the thermoplastic resin layer (here, the resin layer 33) which is the front layer of the flat plate portion 21A on which the image sensor IC 13 is mounted. Thus, it is possible to make flowing of the thermoplastic resin relatively uniform in the resin layer which is a lower layer in the flat plate portion 21A.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A camera module comprising:
   an image sensor including a light receiving surface;
   a lens unit configured to condense light on the light receiving surface;
   a resin multilayer board including a plurality of thermoplastic resin layers stacked in a direction perpendicular or substantially perpendicular to the light receiving surface of the image sensor;
   a mounting electrode located on a thermoplastic resin layer, which is a front layer of the resin multilayer board, and on which the image sensor is mounted; and
   a via-hole conductor provided within at least one of the thermoplastic resin layers of the resin multilayer board and electrically connected to the mounting electrode; wherein
   the resin multilayer board includes:
      a flat plate portion including a surface on which the mounting electrode is provided; and
      a rigid portion including a greater number of thermoplastic resin layers than that of the flat plate portion; and
   the via-hole conductor is arranged to avoid in the flat plate portion the thermoplastic resin layer which is a front layer on which the mounting electrode is located.

2. The camera module according to claim 1, wherein the via-hole conductor is arranged in the rigid portion so as to avoid the flat plate portion.

3. The camera module according to claim 1, further comprising:
- a mounted component embedded in the resin multilayer board; and
- the mounted component is arranged in the rigid portion so as to avoid the flat plate portion.

4. The camera module according to claim 1, wherein the rigid portion overlaps a side of the image sensor.

5. The camera module according to claim 1, wherein
the light receiving surface faces the flat plate portion side; and
the flat plate portion includes a through hole facing the light receiving surface.

6. The camera module according to claim 5, wherein the through hole is configured to define an optical path that optically connects the lens unit and the image sensor.

7. The camera module according to claim 5, wherein the lens unit covers the through hole at the surface of the flat plate portion.

8. The camera module according to claim 5, wherein the lens unit includes a lens and a lens drive portion, and the lens is arranged such that an optical axis of the lens coincides or substantially coincides with a center of the opening of the through hole.

9. The camera module according to claim 1, wherein the rigid portion includes a cavity space in which the image sensor is located.

10. The camera module according to claim 9, further comprising a cover member arranged to cover the cavity space.

11. The camera module according to claim 1, wherein the image sensor includes an integrated circuit and a plurality of photodetectors.

12. The camera module according to claim 1, wherein the via-hole conductor lens unit is electrically connected to the image sensor and the lens unit.

13. The camera module according to claim 1, further comprising a circuit element arranged in the rigid portion so as to avoid the flat plate portion.

14. The camera module according to claim 1, wherein a cavity space is provided on a surface of the resin multilayer board on which the lens unit is located.

15. The camera module according to claim 14, wherein the lens unit is close to or adjacent to the cavity space.

16. The camera module according to claim 1, wherein the via-hole electrode is located directly below the lens unit in the flat plate portion.

* * * * *